(12) United States Patent
Devarajan et al.

(10) Patent No.: US 10,355,109 B2
(45) Date of Patent: Jul. 16, 2019

(54) SPACER FORMATION ON SEMICONDUCTOR DEVICE

(71) Applicant: International Business Machines Corporation, Armonk, NY (US)

(72) Inventors: Thamarai Selvi Devarajan, Albany, NY (US); Sanjay C. Mehta, Niskayuna, NY (US); Eric R. Miller, Schenectady, NY (US); Soon-Cheon Seo, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/807,717

(22) Filed: Nov. 9, 2017

(65) Prior Publication Data

US 2018/0076302 A1 Mar. 15, 2018

Related U.S. Application Data

(60) Division of application No. 15/229,665, filed on Aug. 5, 2016, now Pat. No. 9,911,831, which is a (Continued)

(51) Int. Cl.
*H01L 29/66* (2006.01)
*H01L 21/8234* (2006.01)
(Continued)

(52) U.S. Cl.
CPC .......... *H01L 29/66795* (2013.01); *H01L 21/823431* (2013.01); *H01L 21/823468* (2013.01);
(Continued)

(58) Field of Classification Search
CPC .......... H01L 29/66795; H01L 29/0653; H01L 29/4238; H01L 29/66545; H01L 29/7855;
(Continued)

(56) References Cited

U.S. PATENT DOCUMENTS 7,074,662 B2 * 7/2006 Lee .................. H01L 29/42384
438/199
9,443,855 B1 9/2016 Devarajan et al.
(Continued)

OTHER PUBLICATIONS

List of IBM Patents or Patent Applications Treated as Related; (Appendix P), Filed Nov. 9, 2017; 2 pages.

*Primary Examiner* — Matthew L Reames
(74) *Attorney, Agent, or Firm* — Cantor Colburn LLP; Steven Meyers

(57) ABSTRACT

A method for forming a semiconductor device comprising forming a semiconductor fin on a substrate, forming a first sacrificial gate stack over a first channel region of the fin and forming a second sacrificial gate stack over a second channel region of the fin, forming spacers adjacent to the first sacrificial gate stack and the second sacrificial gate stack, depositing a first liner layer on the spacers, the first sacrificial gate stack and the second sacrificial gate stack, depositing a first sacrificial layer on the first liner layer, removing a portion of the first sacrificial layer over the first gate stack to expose a portion of the first liner layer on the first sacrificial gate stack, and growing a first semiconductor material on exposed portions of the fin to form a first source/drain region adjacent to the first gate sacrificial gate stack.

3 Claims, 16 Drawing Sheets

Related U.S. Application Data continuation of application No. 14/969,021, filed on Dec. 15, 2015, now Pat. No. 9,443,855.

(51) Int. Cl.
| | |
|---|---|
| *H01L 21/8238* | (2006.01) |
| *H01L 29/06* | (2006.01) |
| *H01L 29/423* | (2006.01) |
| *H01L 29/78* | (2006.01) |
| *H01L 21/84* | (2006.01) |

(52) U.S. Cl.
CPC ............... *H01L 21/823481* (2013.01); *H01L 21/823814* (2013.01); *H01L 21/823821* (2013.01); *H01L 21/823864* (2013.01); *H01L 21/845* (2013.01); *H01L 29/0653* (2013.01); *H01L 29/4238* (2013.01); *H01L 29/66545* (2013.01); *H01L 29/7855* (2013.01)

(58) Field of Classification Search
CPC ..... H01L 21/823431; H01L 21/823468; H01L 21/823821; H01L 21/823864; H01L 21/845

See application file for complete search history.

(56) References Cited

U.S. PATENT DOCUMENTS

2016/0099322 A1\* 4/2016 Cheng ................. H01L 27/0924
257/369
2017/0170301 A1 6/2017 Devarajan et al.

\* cited by examiner

SPACER FORMATION ON SEMICONDUCTOR DEVICE

DOMESTIC PRIORITY

This application is a division of U.S. application Ser. No. 15/229,665 filed Aug. 5, 2016, which is a continuation of U.S. Pat. No. 9,443,855 issued Sep. 13, 2016, the disclosures of both of which are incorporated herein by reference in their entirety.

BACKGROUND

The present invention relates to semiconductor devices, and more specifically, to spacer formation on semiconductor devices.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (nFET) and p-type field effect transistors (nFET) are two types of complementary MOSFETs. The nFET uses electrons as the current carriers and with n-doped source and drain junctions. The pFET uses holes as the current carriers and with p-doped source and drain junctions.

Typically the gate stacks of MOSFET devices have spacers comprising a nitride or oxide material that are arranged adjacent to sidewalls of the gate stacks.

As the scale of MOSFET devices continues to decrease, fabricating effective devices becomes more challenging.

SUMMARY

According to an embodiment of the present invention, a method for forming a semiconductor device comprising forming a semiconductor fin on a substrate, forming a first sacrificial gate stack over a first channel region of the fin and forming a second sacrificial gate stack over a second channel region of the fin, forming spacers adjacent to the first sacrificial gate stack and the second sacrificial gate stack, depositing a first liner layer on the spacers, the first sacrificial gate stack and the second sacrificial gate stack, depositing a first sacrificial layer on the first liner layer, removing a portion of the first sacrificial layer over the first gate stack to expose a portion of the first liner layer on the first sacrificial gate stack, and growing a first semiconductor material on exposed portions of the fin to form a first source/drain region adjacent to the first gate sacrificial gate stack.

According to another embodiment of the present invention, a method for forming a semiconductor device comprises forming a semiconductor fin on a substrate, forming a first sacrificial gate stack over a first channel region of the fin and forming a second sacrificial gate stack over a second channel region of the fin, forming spacers adjacent to the first sacrificial gate stack and the second sacrificial gate stack, depositing a first liner layer on the spacers, the first sacrificial gate stack and the second sacrificial gate stack, depositing a first sacrificial layer on the first liner layer, patterning a first mask over the second sacrificial gate stack, removing a portion of the first sacrificial layer over the first gate stack to expose a portion of the first liner layer on the first sacrificial gate stack, removing the first mask, removing exposed portions of the first liner layer, growing a first semiconductor material on exposed portions of the fin to form a first source/drain region adjacent to the first gate sacrificial gate stack, depositing a second sacrificial layer on the first source drain region, the first sacrificial gate stack and the second sacrificial gate stack, patterning a second mask over the first sacrificial gate stack, removing a portion of the second sacrificial layer and the first sacrificial layer over the second gate stack, removing the second mask, removing exposed portions of the second liner layer, and growing a second semiconductor material on exposed portions of the fin to form a second source/drain region adjacent to the second gate sacrificial gate stack.

According to yet another embodiment of the present invention, a semiconductor device comprises a semiconductor fin arranged on a substrate, a first gate stack arranged over a first channel region of the fin, a second gate stack arranged over a second channel region of the fin, a first spacer having a first thickness arranged adjacent to the first gate stack, a second spacer having the first thickness arranged adjacent to the second gate stack, a first source/drain region arranged on the fin adjacent to the first spacer, and a second source/drain region arranged on the fin adjacent to the second spacer Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Previous methods and processes for fabricating MOSFET devices have presented a number of challenges as the scale of the devices is reduced.

In this regard, in MOSFET devices, a spacer is often formed adjacent to the gate stacks of the devices. Since the nFET and pFET devices are formed using different materials, the thickness of the spacers may be different when using previous fabrication processes. As performance tolerances become higher, the difference in the spacer thickness results in a reduction in the performance of the devices. Further, when the spacer gap between the gate stacks are different, it becomes more challenging to build a smaller device that performs within tolerances.

Figure 1:
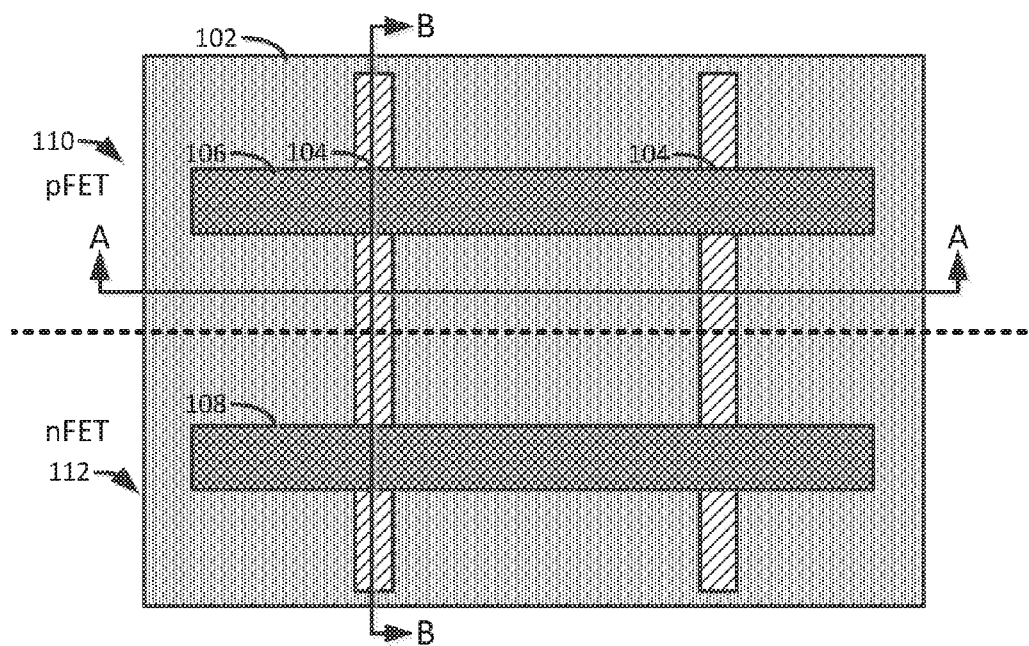
FIG. 1 illustrates a top view of semiconductor fins 104 that are arranged on an insulator layer of a substrate.

FIGS. 1-31 provide an exemplary method and resultant semiconductor device that substantially addresses some of the challenges described above. FIG. 1 illustrates a top view of semiconductor fins 104 that are arranged on an insulator layer of a substrate 102. Though the illustrated embodiment shows a silicon-on-insulator (SOI) substrate with a buried oxide (BOX) layers, alternate embodiments may include a bulk semiconductor substrate. Non-limiting examples of suitable substrate materials include.

The fins 104 are formed from a suitable semiconductor material such as, for example, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. The fins 104 are formed in a pFET region 110 and an nFET region 112 of the substrate 102. The fins 104 may be formed by, for example, a lithographic patterning and etching process such as reactive ion etching, or another suitable fabrication process such as sidewall image transfer.

Sacrificial gate stacks 106 and 108 are arranged on the substrate 102 and over channel regions of the fins 104. The sacrificial gate stacks 106 and 108 may be formed by, for example, depositing a layer of amorphous silicon or polysilicon over the substrate 102 and the fins 104 and 108. A hardmask layer 302 (of FIG. 3) may be deposited over the silicon layer. A lithographic patterning and etching process such as, for example, reactive ion etching may be performed to form the sacrificial gate stacks 106 and 108 over channel regions of the fins 104 and 106.

Figure 2:
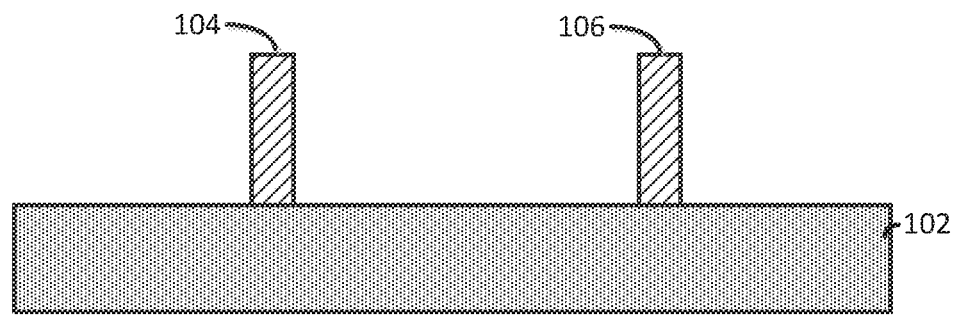
FIG. 2 illustrates a cutaway view along the line A-A of FIG. 1 of the substrate and the fins.

FIG. 2 illustrates a cutaway view along the line A-A of FIG. 1 of the substrate 102 and the fins 104 and 106.

Figure 3:
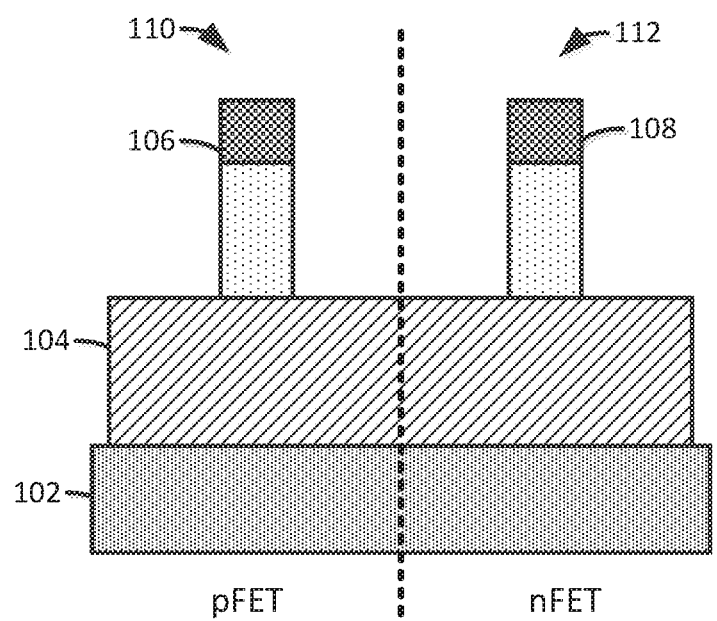
FIG. 3 illustrates a cutaway view along the line B-B showing the substrate, the fin, the sacrificial gate stacks and a hardmask.

FIG. 3 illustrates a cutaway view along the line B-B showing the substrate 102, the fin 104, the sacrificial gate stacks 106 and a hardmask 302. Non-limiting examples of suitable materials for the hard mask 302 include silicon oxide, silicon nitride, or any combination thereof.

Figure 4:
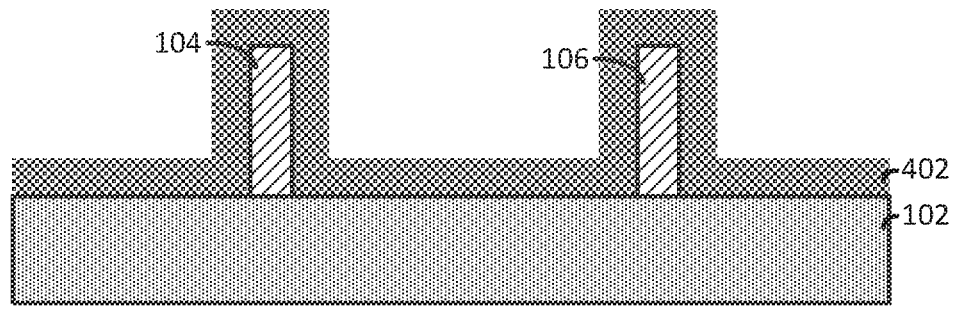
FIGS. 4 and 5 illustrate cutaway views following the deposition of a layer of spacer material over exposed portions of the substrate, the fin, and the sacrificial gate stacks.
Figure 5:
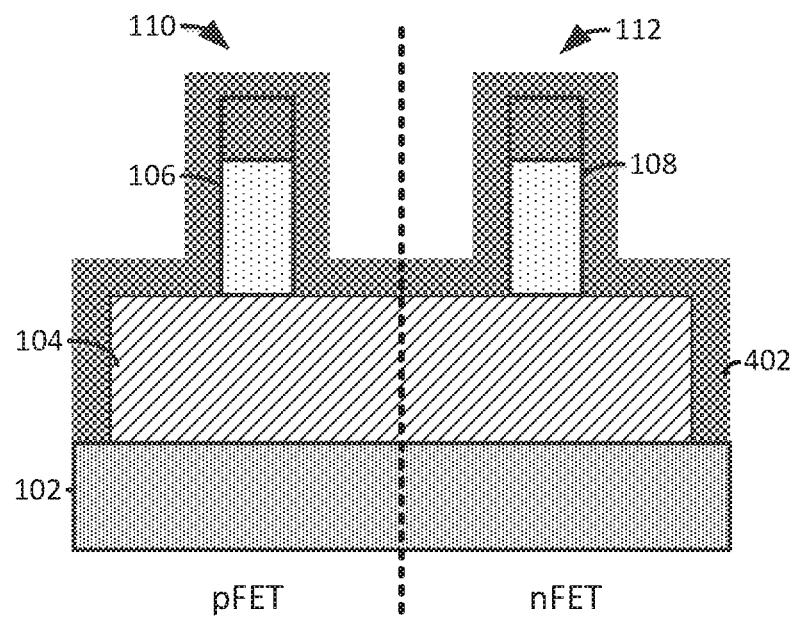

FIGS. 4 and 5 illustrate cutaway views following the deposition of a layer of spacer material 402 over exposed portions of the substrate 102, the fin 104, and the sacrificial gate stacks 106 and 108. The layer of spacer material 402 may contain a nitride or low-K material such as Si, N, B, and C that has a dielectric constant lower than six. For example, the spacer material 402 may include SiOCN, SiBN, SiCN, SiBCN, or any combination thereof. FIG. 5 illustrates a cutaway view of the spacer material 402 over the sacrificial gate stacks 106 and 108.

Figure 6:
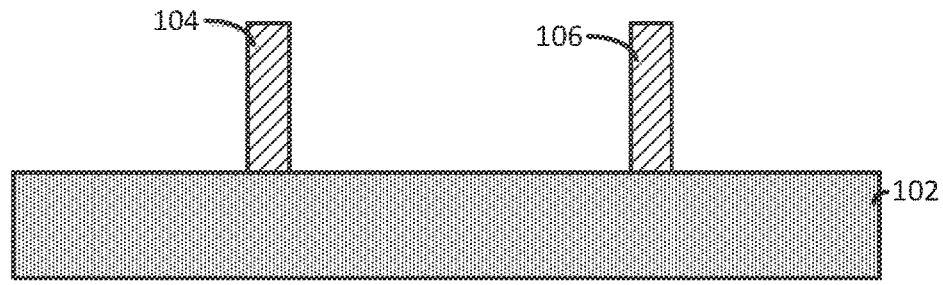
FIGS. 6 and 7 illustrate cutaway views following an anisotropic etching process.
Figure 7:
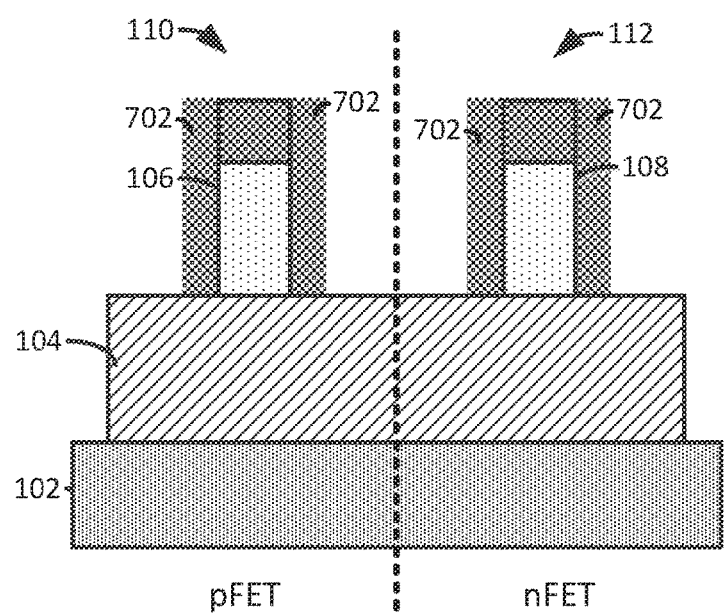

FIGS. 6 and 7 illustrate cutaway views following an anisotropic etching process, such as, for example, reactive ion etching that removes portions of the layer of spacer material 402 (of FIG. 4) to form spacers 702 adjacent to the sacrificial gate stacks 106 and 108.

Figure 8:
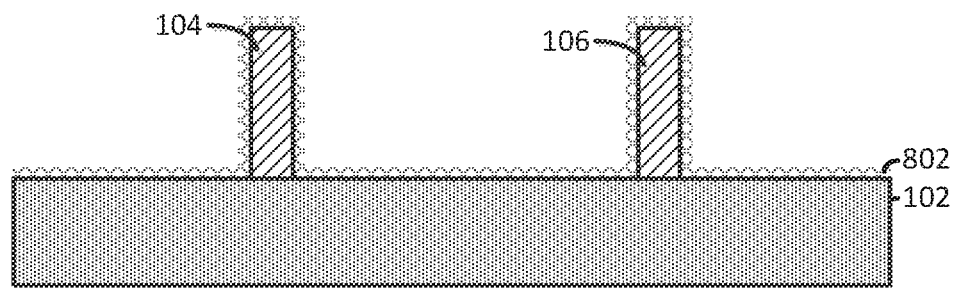
FIGS. 8 and 9 illustrate cutaway views following the deposition of a layer of oxide material over exposed portions of the substrate, the fins, the spacers, and the sacrificial gate stacks.
Figure 9:
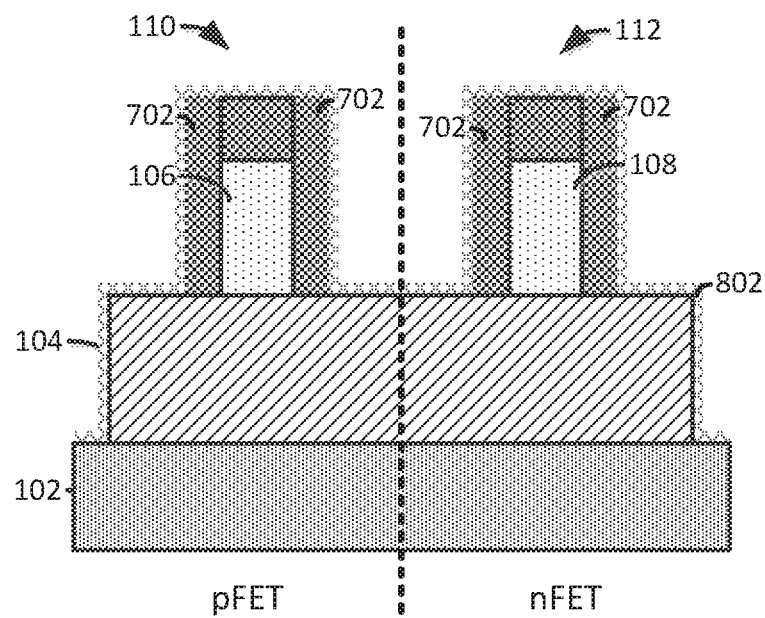

FIGS. 8 and 9 illustrate cutaway views following the deposition of a layer of oxide material 802 over exposed portions of the substrate 102, the fins 104, the spacers 702, and the sacrificial gate stacks 106 and 108. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 10:
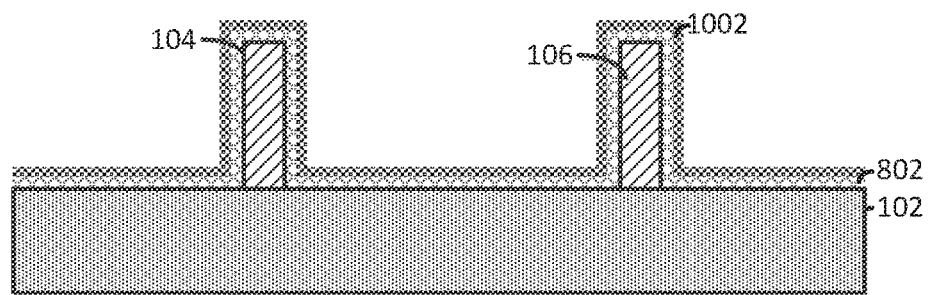
FIGS. 10 and 11 illustrate cutaway views following the deposition of a layer of nitride material over the layer of oxide material.
Figure 11:
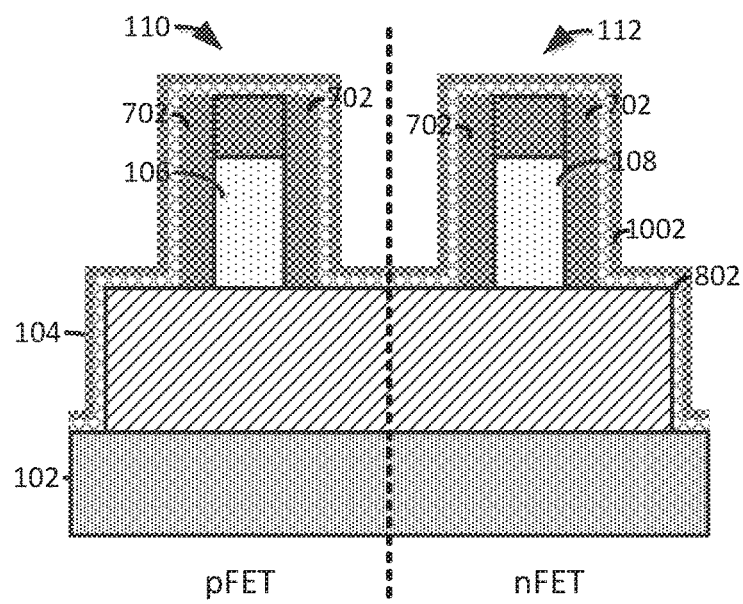

FIGS. 10 and 11 illustrate cutaway views following the deposition of a layer of nitride material 1002 over the layer of oxide material 802. The nitride material 802 may include, for example, SiN material. The nitride material 1002 may be formed by any suitable deposition process, such as, for example, plasma enhanced chemical vapor deposition (PECVD) or physical vapor deposition (PVD).

Figure 12:
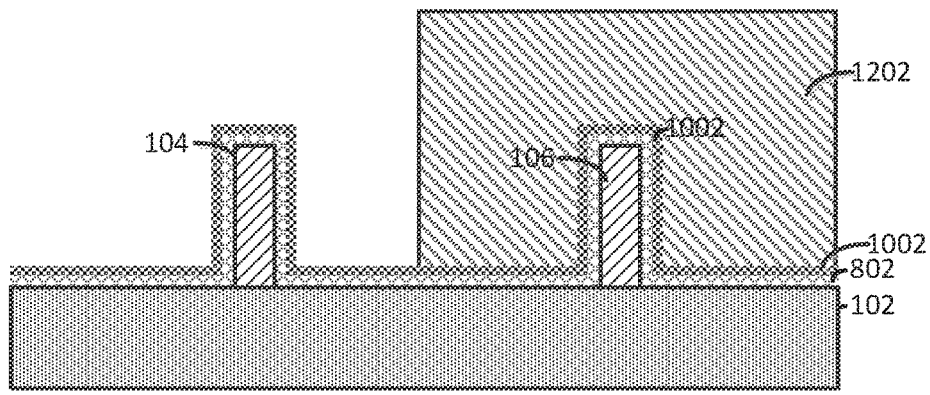
FIGS. 12 and 13 illustrate cutaway views following the patterning of a mask over portions of the nitride material and the sacrificial gate stack in the nFET region.
Figure 13:
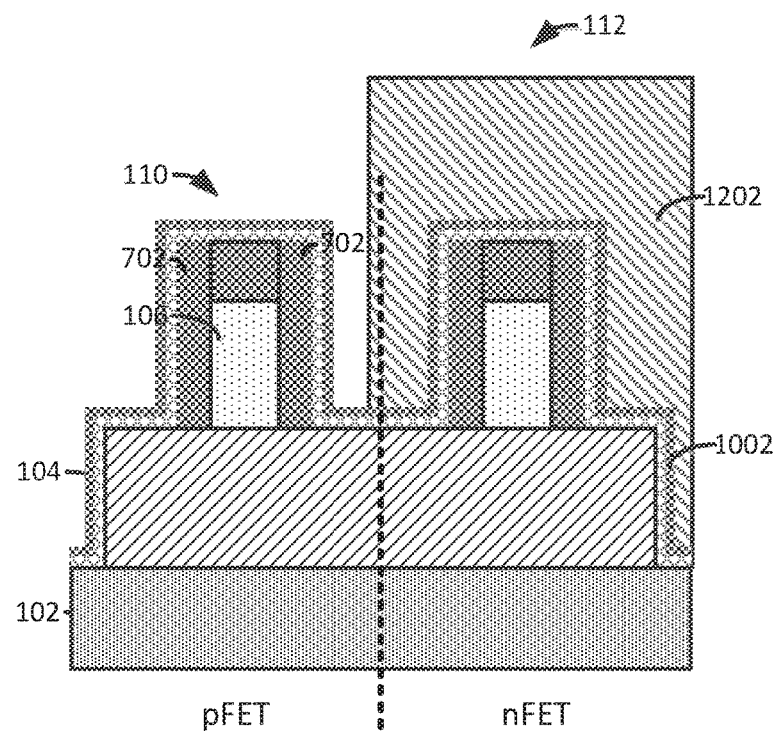

FIGS. 12 and 13 illustrate cutaway views following the patterning of a mask 1202 over portions of the nitride material 1002 and the sacrificial gate stack 108 in the nFET region 112. Suitable masks 1202 include photoresists, electron-beam resists, ion-beam resists, X-ray resists, and etch resists. The mask 1202 may a polymeric spin on material or a polymeric material.

Figure 14:
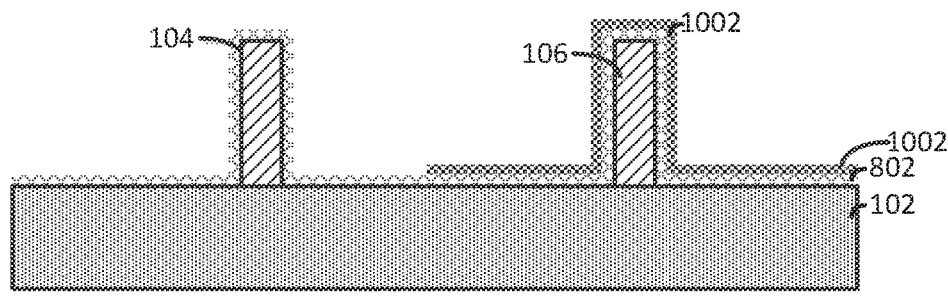
FIGS. 14 and 15 illustrate cutaway views following an etching process.
Figure 15:
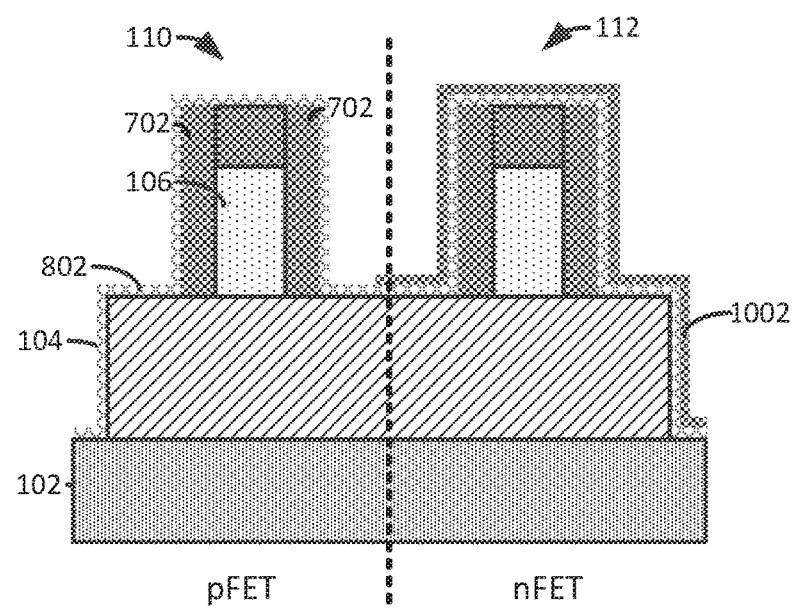

FIGS. 14 and 15 illustrate cutaway views following an etching process such as, for example, reactive ion etching or wet etching to remove exposed portions of the nitride material 1002 that expose portions of the oxide material in the pFET region 110. Following the etching process, the mask 1202 may be removed by, for example, an ashing process.

Figure 16:
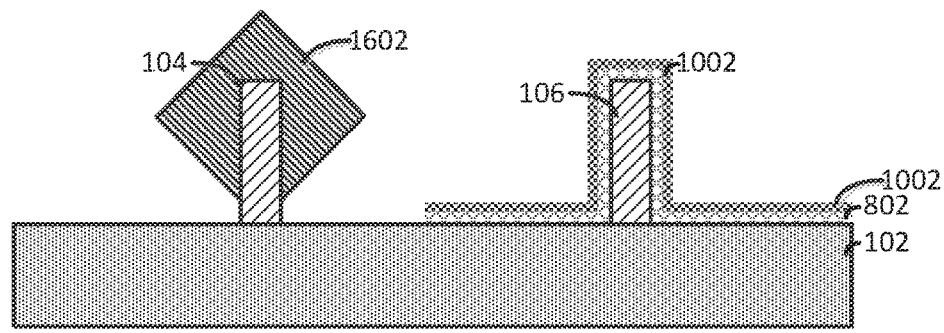
FIGS. 16 and 17 illustrate cutaway views of the resultant structure following the formation of epitaxially grown source/drain regions.
Figure 17:
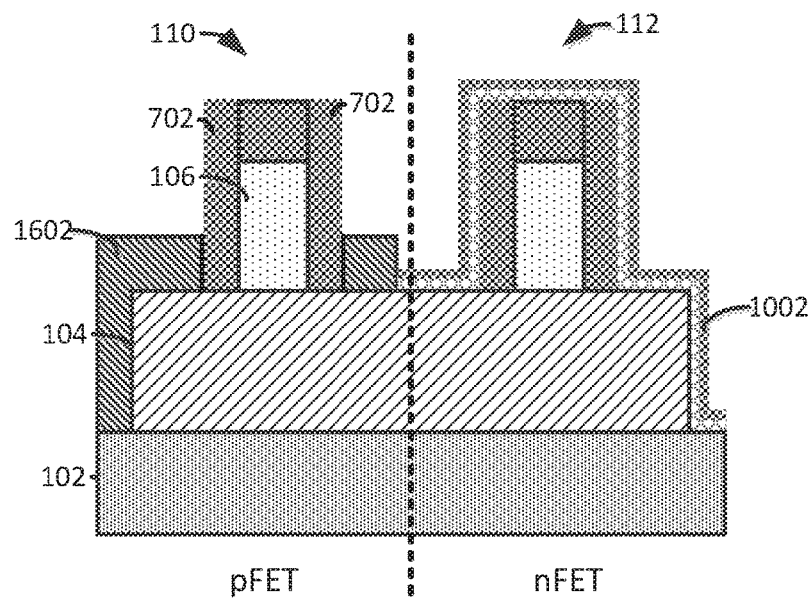

FIGS. 16 and 17 illustrate cutaway views of the resultant structure following the formation of epitaxially grown source/drain regions 1602 on exposed portions of the fin 104 in the pFET region 110. Prior to the epitaxial growth process, the exposed portions of the layer of oxide material 802 are removed by, for example, a suitable selective etching process. In this regard, an epitaxial growth process is performed to deposit a crystalline layer onto a crystalline substrate beneath. The underlying substrate (the fin 104) acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of device. In some embodiments, the source/drain region may be doped using an ion implantation process.

Figure 18:
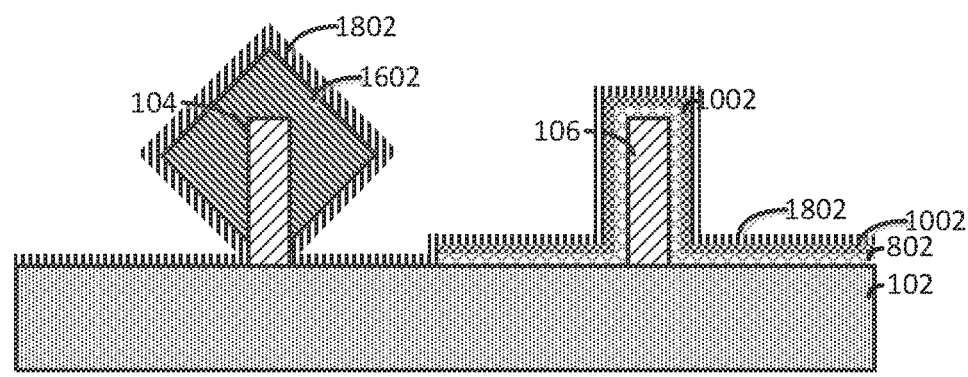
FIGS. 18 and 19 illustrate cutaway views of the resultant structure following the deposition of a second layer of nitride material over the source/drain regions in the pFET region.
Figure 19:
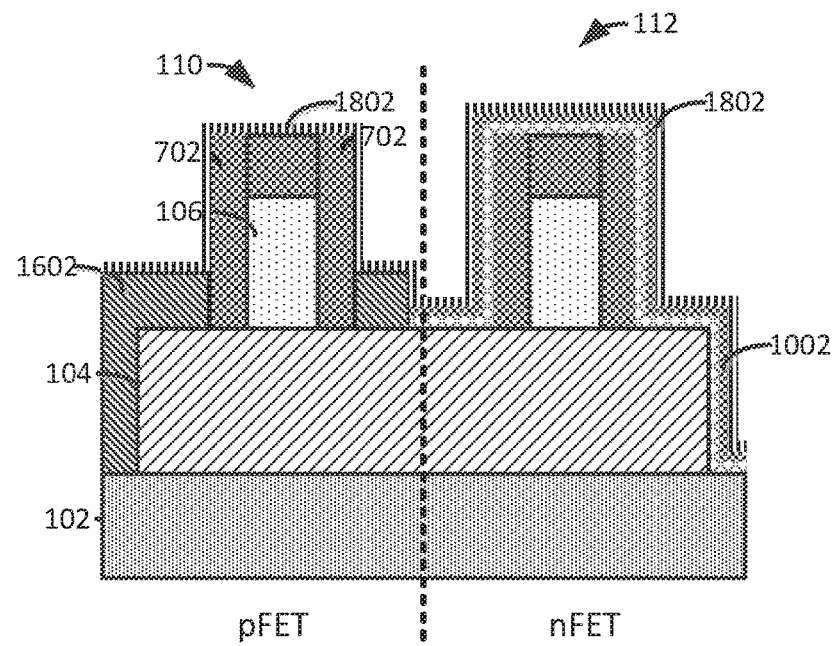

FIGS. 18 and 19 illustrate cutaway views of the resultant structure following the deposition of a second layer of nitride material 1802 over the source/drain regions 1602 in the pFET region 110 and the exposed portions of the nitride material 1002 in the nFET region 112. The second layer of nitride material 1802 may include, for example, SiN material. The second layer of nitride material 1802 may be formed by any suitable deposition process, such as, for example, plasma enhanced chemical vapor deposition (PECVD) or physical vapor deposition (PVD).

Figure 20:
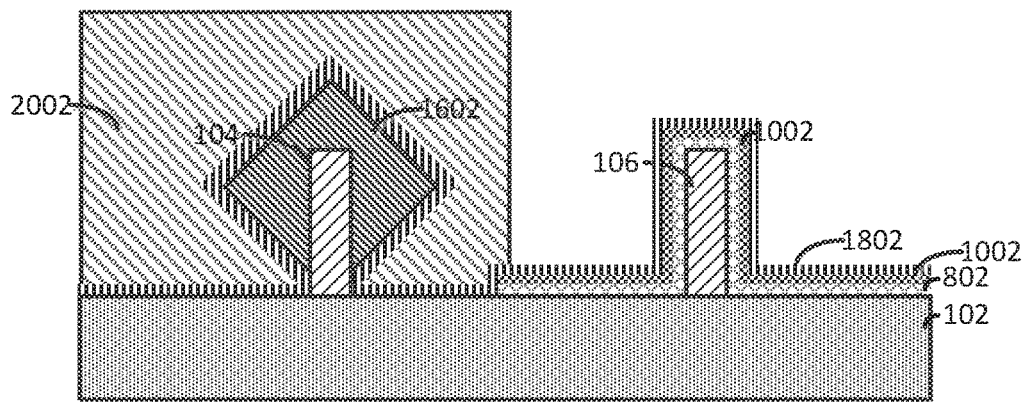
FIGS. 20 and 21 illustrate cutaway views following the formation of a mask on second layer of nitride material over the pFET region.
Figure 21:
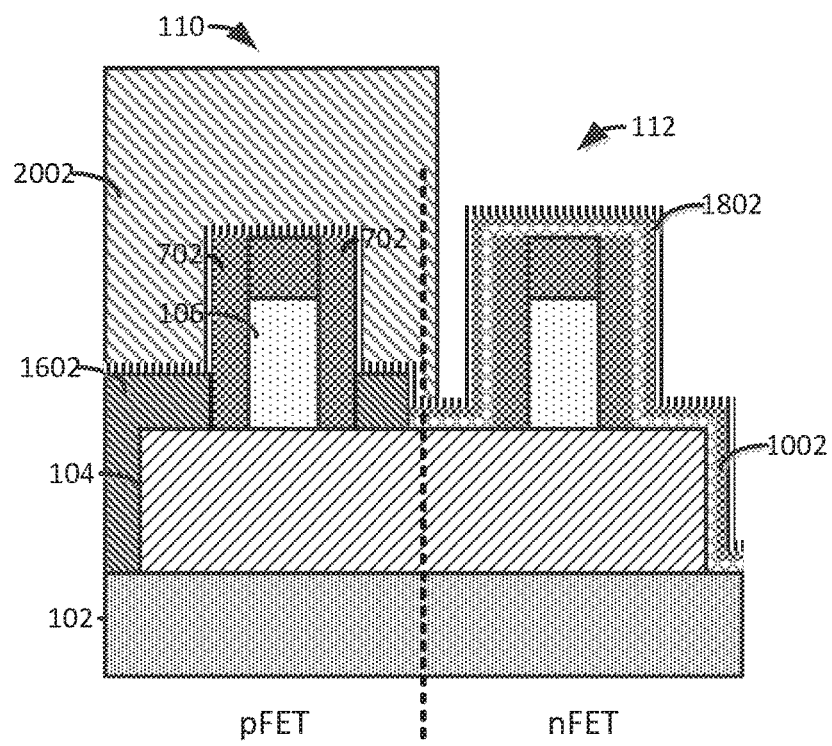

FIGS. 20 and 21 illustrate cutaway views following the formation of a mask 2002 on second layer of nitride material 1802 over the pFET region 110. The mask 2002 may be patterned and formed using any suitable lithographic patterning process.

Figure 22:
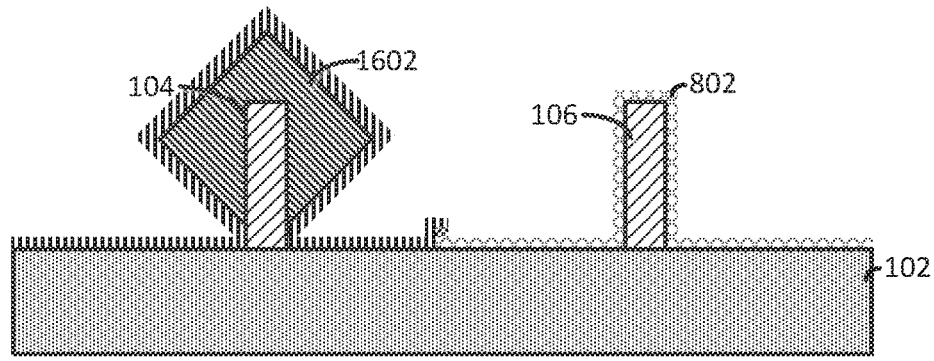
FIGS. 22 and 23 illustrate cutaway views following an etching process.
Figure 23:
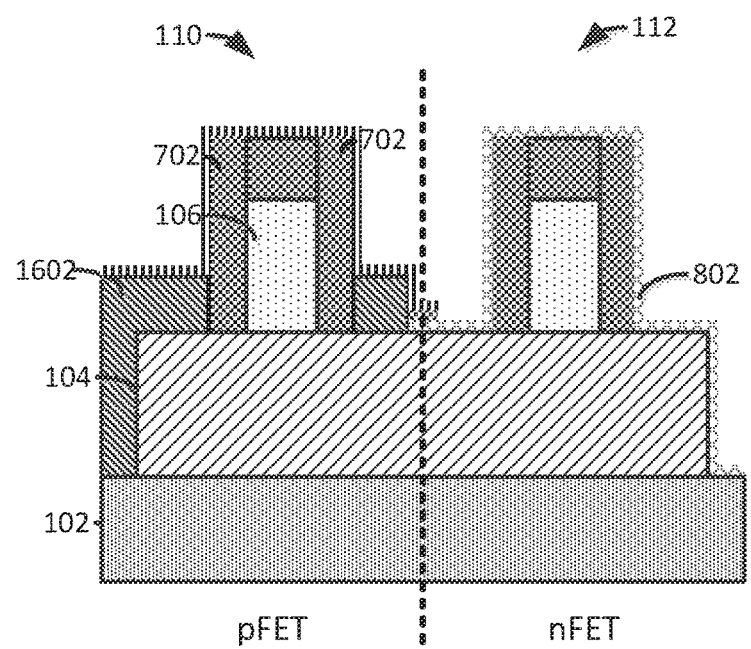

FIGS. 22 and 23 illustrate cutaway views following an etching process such as, for example, reactive ion etching or wet etching to remove exposed portions of the second layer of nitride material 1802 and the nitride material 1002 to expose portions of the layer of oxide material 802 in the nFET region 1202. Following the etching process, the mask 2002 may be removed by, for example, an ashing process.

Figure 24:
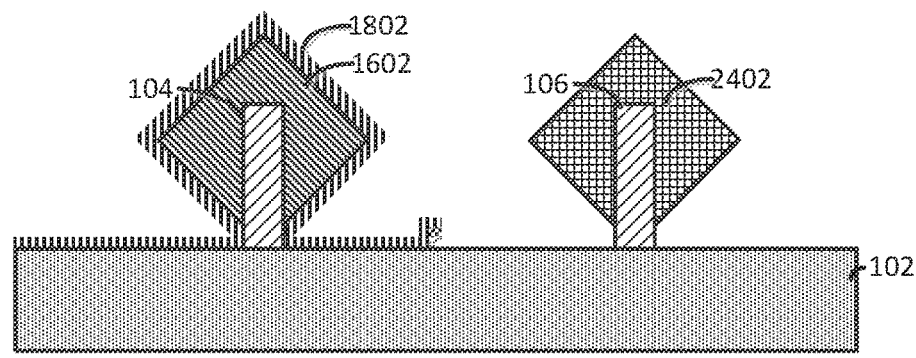
FIGS. 24 and 25 illustrate cutaway views of the resultant structure following the formation of epitaxially grown source/drain regions.
Figure 25:
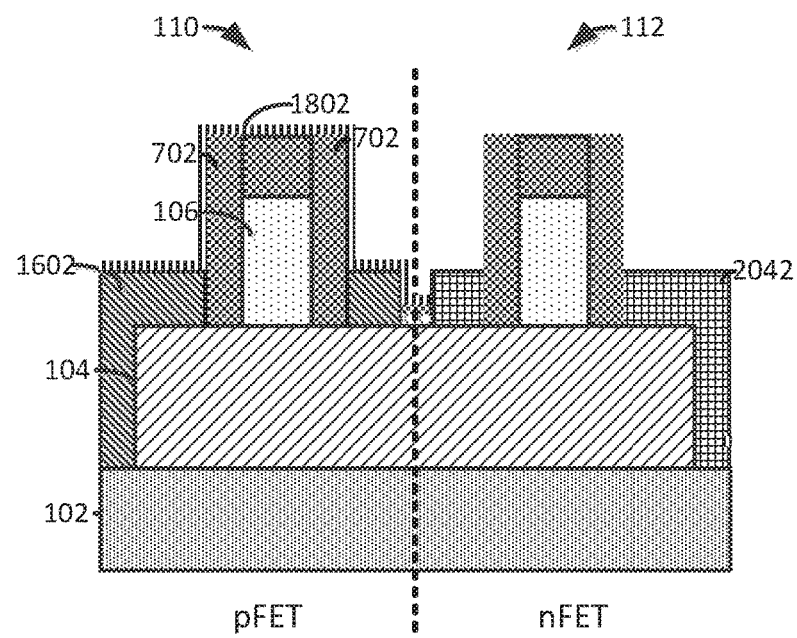

FIGS. 24 and 25 illustrate cutaway views of the resultant structure following the formation of epitaxially grown source/drain regions 2402 on exposed portions of the fin 104 in the nFET region 112. Prior to the epitaxial growth process, the exposed portions of the layer of oxide material 802 are removed by, for example, a suitable selective etching process. In this regard, an epitaxial growth process is performed to deposit a crystalline layer onto a crystalline substrate beneath. The underlying substrate (the fin 104) acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of device. In some embodiments, the source/drain region may be doped using an ion implantation process.

Figure 26:
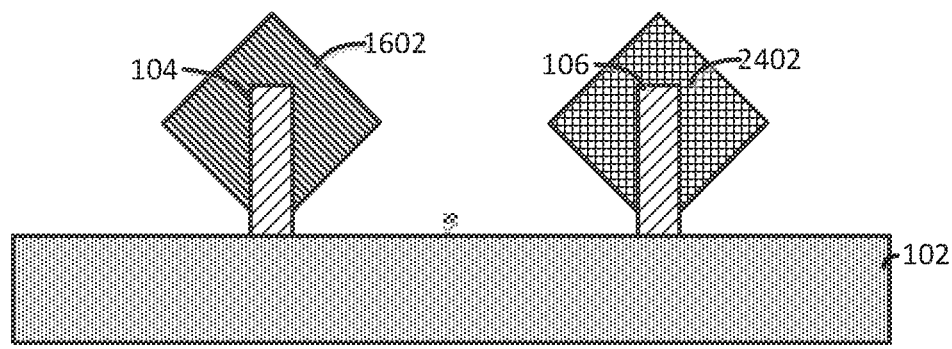
FIGS. 26 and 27 illustrate cutaway views of the resultant structure following a selective etching process.
Figure 27:
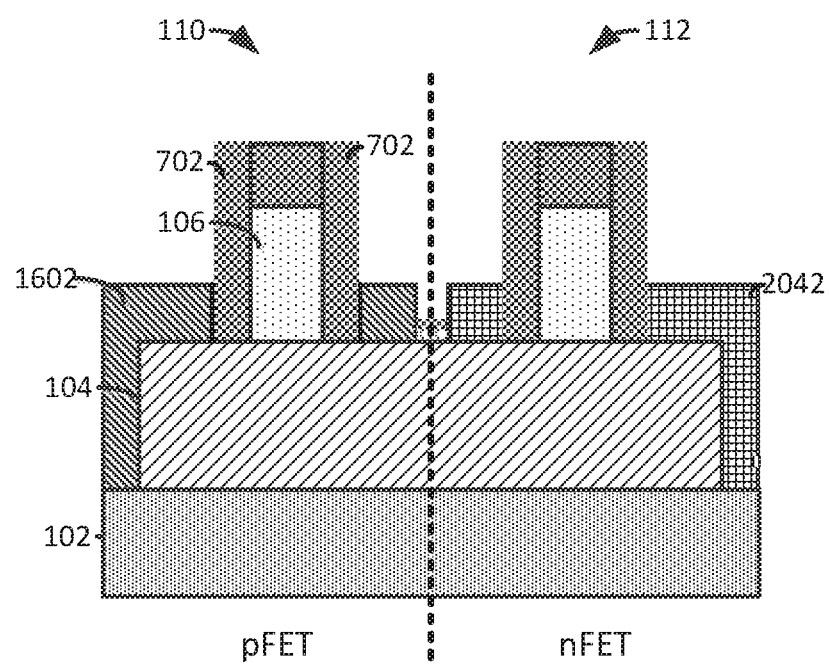

FIGS. 26 and 27 illustrate cutaway views of the resultant structure following a selective etching process such as, for example, reactive ion etching or wet etching that removes the exposed portions of the second layer of nitride material 1802 (of FIGS. 24 and 25) from the pFET regions 110. Following the formation of the source/drain regions 1602 and/or 2402, a silicide region (not shown) may be formed on exposed portions of the source/drain regions 1602 and 2402. A silicide may be formed by, for example, depositing a conductive metal on exposed surfaces of the source/drain regions 1602 and 2402 and performing an annealing process that forms a layer of silicide on the source/drain regions 1602 and 2402.

Figure 28:
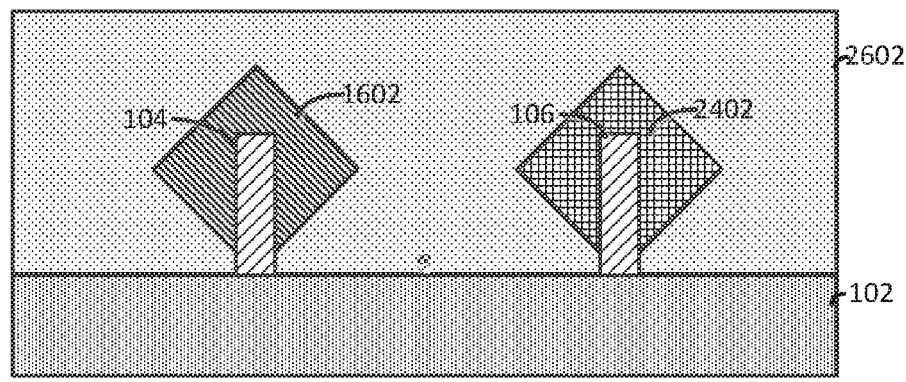
FIGS. 28 and 29 illustrate cutaway views of the resultant structure following the deposition of an insulating layer.
Figure 29:
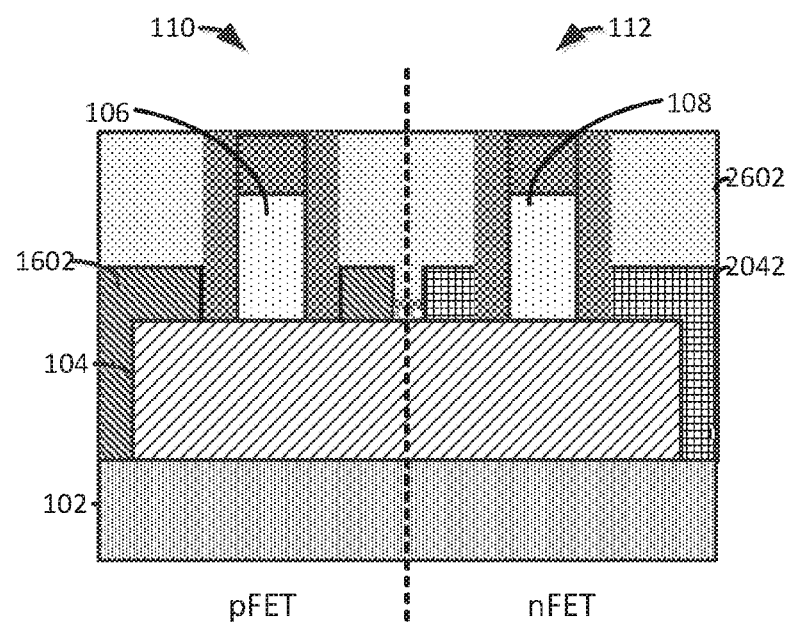

FIGS. 28 and 29 illustrate cutaway views of the resultant structure following the deposition of an insulating layer 2602. The insulating layer 2602 may be formed from, for example, a low-k dielectric oxide, including but not limited to, silicon dioxide, spin-on-glass, a flowable oxide, a high density plasma oxide, borophosphosilicate glass (BPSG), or any combination thereof.

The insulating layer 2602 is deposited by a suitable deposition process, including, but not limited to CVD, PVD, plasma enhanced CVD, atomic layer deposition (ALD), evaporation, chemical solution deposition, or like processes. The insulating layer 2602 may further comprise a liner (e.g., silicon nitride) (not shown) that is deposited before the oxide. Following the deposition of the insulating layer 2602, a planarization process such as, for example, chemical mechanical polishing may be performed.

Figure 30:
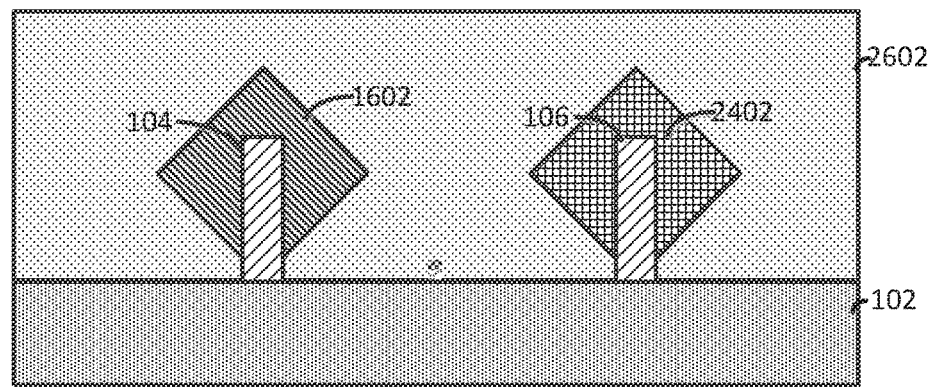
FIGS. 30 and 31 illustrate cutaway views of the resultant structure following formation of metal gate stacks.
Figure 31:
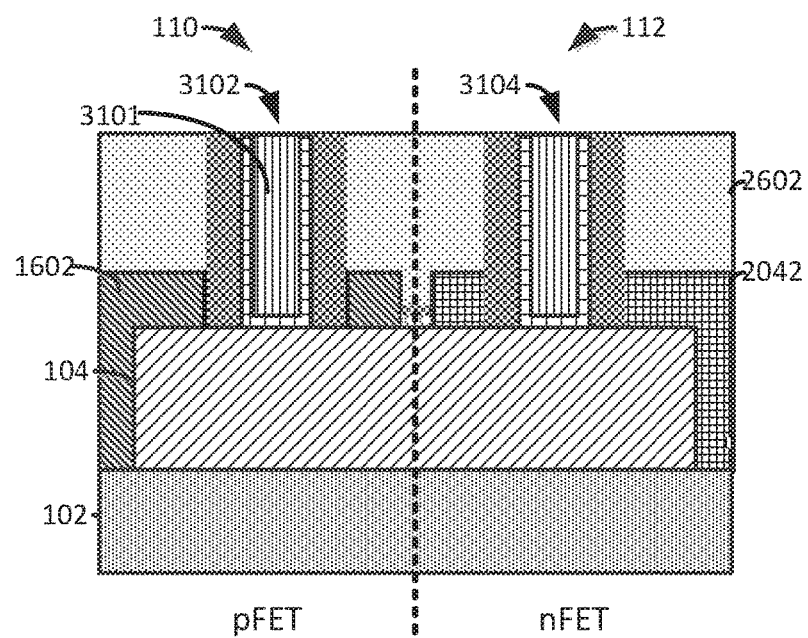

FIGS. 30 and 31 illustrate cutaway views of the resultant structure following formation of metal gate stacks 3102 and 3104 that are formed by, for example, removing the sacrificial gate stacks 106 and 108 (of FIGS. 28 and 29) to expose channel regions of the fins 104. Once the channel regions are exposed, replacement metal gate stacks are formed over the channel regions.

The gate stack includes high-k metal gates formed, for example, by filling a sacrificial gate stack opening (not shown) with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the pFET 110 and the nFET 112. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal 3101 is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

The embodiments described herein show a replacement metal gate (gate last) process flow however, in an alternate embodiment, similar methods described herein may be used in a gate first process flow, where as opposed to forming the sacrificial gate stacks 106 and 108, a metal gate is formed. Following the formation of the metal gate, the process flow of the alternate embodiment is similar to those described herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device comprising:
    a semiconductor fin arranged on a substrate, wherein the fin includes an n-type field effect transistor (nFET) region and a p-type field effect transistor (pFET) region;
    a first gate stack arranged over a first channel region of the fin in the pFET region;
    a second gate stack arranged over a second channel region of the fin in the nFET region;
    a first spacer having a first thickness arranged adjacent to the first gate stack in the pFET region;
    a second spacer having the first thickness arranged adjacent to the second gate stack in the nFET region;
    a first source/drain region epitaxially grown on the fin adjacent to the first spacer in the pFET region; and
    a second source/drain region epitaxially grown on the fin adjacent to the second spacer in the nFET region.

2. The device of claim 1, further comprising a layer of nitride material arranged on the substrate between the first source/drain region and the second source/drain region.

3. The device of claim 1, wherein the first source/drain region includes a crystalline semiconductor material.

* * * * *